United States Patent
Kuwahara et al.

(10) Patent No.: US 8,025,766 B2
(45) Date of Patent: Sep. 27, 2011

(54) BORON NITRIDE-BASED FIBER PAPER AND MANUFACTURING PROCESS THEREOF

(75) Inventors: Hiroaki Kuwahara, Iwakuni (JP); Yoshio Bando, Tsukuba (JP); Chunyi Zhi, Tsukuba (JP); Chengchun Tang, Tsukuba (JP); Dmitri Golberg, Tsukuba (JP)

(73) Assignees: Teijin Limited, Osaka (JP); National Institute for Materials Science, Ibaraki (JP)

( * ) Notice: Subject to any disclaimer, the term of this patent is extended or adjusted under 35 U.S.C. 154(b) by 1 day.

(21) Appl. No.: 12/529,845

(22) PCT Filed: Mar. 4, 2008

(86) PCT No.: PCT/JP2008/054247
§ 371 (c)(1),
(2), (4) Date: Sep. 3, 2009

(87) PCT Pub. No.: WO2008/108484
PCT Pub. Date: Sep. 12, 2008

(65) Prior Publication Data
US 2010/0108276 A1    May 6, 2010

(30) Foreign Application Priority Data

Mar. 5, 2007 (JP) ................. 2007-054089

(51) Int. Cl.
*D21F 11/00* (2006.01)
(52) U.S. Cl. .................................................. 162/157.1
(58) Field of Classification Search ............... 162/157.1, 162/102, 152, 201; 524/404; 977/700, 831
See application file for complete search history.

(56) References Cited

U.S. PATENT DOCUMENTS

| | | | |
|---|---|---|---|
| 4,309,244 A | 1/1982 | Tworek et al. | |
| 4,309,245 A | 1/1982 | Tworek et al. | |
| 2009/0221734 A1* | 9/2009 | Kuwahara et al. | 524/404 |

FOREIGN PATENT DOCUMENTS

| | | |
|---|---|---|
| GB | 1 574 077 A | 9/1980 |
| JP | 11-189957 A | 7/1999 |
| JP | 11-323769 A | 11/1999 |
| JP | 2000-109306 A | 4/2000 |
| JP | 2004-175618 A | 6/2004 |
| JP | 2004-183178 A | 7/2004 |
| JP | 2004-190183 A | 7/2004 |
| JP | 2006-335604 A | 12/2006 |

* cited by examiner

*Primary Examiner* — Mark Halpern
(74) *Attorney, Agent, or Firm* — Sughrue Mion, PLLC

(57) ABSTRACT

A boron nitride fiber paper having a very small fiber diameter and exhibiting excellent heat resistance, mechanical properties and heat conductivity. The fiber paper is composed of a fiber assembly which contains boron nitride fibers having a fiber diameter of not more than 1 μm in an amount of not less than 40 wt %.

8 Claims, 2 Drawing Sheets

BORON NITRIDE-BASED FIBER PAPER AND MANUFACTURING PROCESS THEREOF

This application is a 371 of PCT/JP2008/054247 filed on 3 Apr. 2008.

TECHNICAL FIELD

The present invention relates to a boron nitride inorganic fiber paper and a manufacturing process thereof. More specifically, it relates to a boron nitride-based fiber paper composed of a fiber assembly which contains boron nitride fibers having a fiber diameter of not more than 1 and a manufacturing process thereof.

BACKGROUND OF THE ART

Inorganic fiber papers which are essentially composed of inorganic compound fibers such as glass fibers, carbon fibers, metal fibers or ceramic fibers and processed to provide paper-like properties have recently been developed. Since various characteristic properties such as heat resistance, electric properties and mechanical properties can be provided to these fiber papers, they are used in a wide variety of fields.

For instance, the use of ceramic fiber papers composed of silica alumina fibers in filters, friction materials and adiabatic materials is now under study, making use of their excellent heat resistance, heat insulating properties and mechanical properties. Since these inorganic fibers are manufactured by melting an inorganic material as the raw material for these fibers in a furnace at 1,200 to 1,500° C. and blowing the molten product with compressed air or a spinner, they contain about 50% of non-fibrous particles. Therefore, these particles must be removed to use these fibers in inorganic fiber papers. As the fibers constituting the inorganic fiber papers which have been obtained heretofore have a relatively large diameter, it has been difficult to make the inorganic fiber papers thin. Therefore, it has been proposed that chopped strands having a fiber diameter of not more than 5 μm should be used as the main fibers in an amount of not less than 50% of the total weight of all the fibers to manufacture a glass fiber nonwoven fabric for printed circuit boards by a wet paper making process (refer to JP-A 11-189957) or that a nonwoven fabric containing not less than 50 mass % of glass chopped strands having an average fiber diameter of not less than 7 μm and 3 to 20 mass % of silica fine fibers having an average fiber diameter of not more than 1 μm should be manufactured (refer to JP-A 2004-183178). Since the fiber nonwoven fabrics obtained by these means contain glass chopped strands, they are unsatisfactory in terms of heat resistance.

Meanwhile, JP-A 2004-190183 and JP-A 2000-109306 disclose that boron nitride fibers typified by boron nitride nanotubes can be prepared by CVD. It can be expected that a compound having improved mechanical properties, heat resistance and heat conductivity can be obtained by adding these boron nitride fibers to a structural material matrix such as a polymer as an inorganic filler having high strength, high elastic modulus, high heat conductivity, insulating properties and high heat resistance. Further, it is expected that if boron nitride fibers can be molded into a thin film, they can be used as a material having higher resistance, strength and heat conductivity than conventional inorganic fibers. However, it has not been reported that a fiber paper is made from boron nitride fibers.

DISCLOSURE OF THE INVENTION

The inventors of the present invention have conducted intensive studies in view of the above prior art and have accomplished the present invention.

It is an object of the present invention to provide a boron nitride-based fiber paper which has solved the problems of the above prior art and has a very small fiber diameter and excellent heat resistance, mechanical properties and heat conductivity. It is another object of the present invention to provide a process of manufacturing the above boron nitride-based fiber paper very easily. Other objects and advantages of the present invention will become apparent from the following description.

That is, firstly, the above objects and advantages of the present invention are attained by a fiber paper composed of a fiber assembly which contains not less than 40 wt % of boron nitride fibers having a fiber diameter of not more than 1 μm.

Secondly, the above objects and advantages of the present invention are attained by a process of manufacturing the fiber paper of the present invention, comprising the steps of:

dispersing a fiber assembly which contains not less than 40 wt % of boron nitride fibers having a fiber diameter of not more than 1 μm into a surfactant aqueous solution or an organic solvent; and making paper from the obtained dispersion.

BEST MODE FOR CARRYING OUT THE INVENTION

Figure 1:
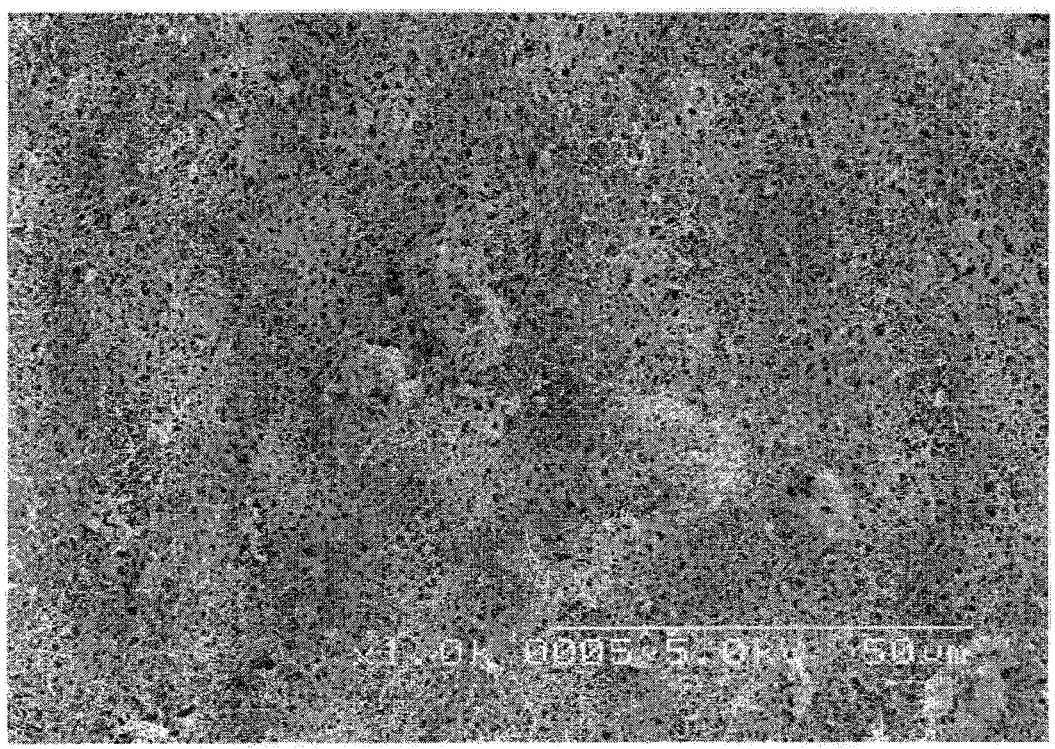
FIG. 1 is a SEM photomicrograph of a fiber paper obtained in Example 1.

The present invention will be described in detail hereinunder.

The boron nitride-based fiber paper of the present invention comprises a fiber assembly which contains not less than 40 wt % of boron nitride fibers having a fiber diameter of not more than 1 μm. The fiber paper of the present invention is composed of a fiber assembly which contains boron nitride fibers as the main component. The thickness of the fiber paper is preferably not less than 10 μm, more preferably 20 μm to 5 mm. The weight of the fiber paper is preferably not less than 100 g/m$^2$, more preferably 200 to 1,000 g/m$^2$. The fiber assembly in the present invention is an assembly of short fibers and/or long fibers which are entangled or not entangled with one another.

When the content of the boron nitride fibers having a fiber diameter of not more than 1 μm in the fiber assembly is lower than 40 wt % in the fiber paper of the present invention, the surface area of the obtained fiber paper becomes small disadvantageously. The content of the boron nitride fibers having a fiber diameter of not more than 1 μm is preferably not less than 50 wt %, more preferably not less than 80 wt %.

The average fiber diameter of the fibers constituting the fiber assembly is preferably 0.4 nm to 1 μm. The average fiber diameter can be determined from the average value of arbitrary 150 fibers by observing the surface texture of the fiber paper through a scanning electron microscope. When the average fiber diameter of the fibers constituting the fiber paper is larger than 1 μm, it is difficult to make the fiber paper thin and the surface area of the fiber paper becomes small disadvantageously. The average aspect ratio of the fibers constituting the fiber assembly is preferably 5 or more. The average aspect ratio can be determined from the average values of the diameters and lengths of arbitrary 150 fibers by observing the surface texture of the fiber paper through a scanning electron microscope.

Boron nitride has such high heat resistance that it can withstand a temperature of 1,000° C. or higher and also excellent corrosion resistance. The fiber assembly is preferably essentially composed of boron nitride fibers in order to obtain a fiber paper having these properties. Boron nitride fibers are contained in the fiber assembly in an amount of preferably 40 to 100 wt %, more preferably 60 to 100 wt %.

Other fibers except for the boron nitride fibers, for example, a fiber structure such as synthetic fibers, natural fibers and inorganic fibers may be contained in the fiber assembly. In this case, the average fiber diameter of the fibers except for the boron nitride fibers may be more than 1 μm but the average fiber diameter of the whole fiber assembly is preferably not more than 1 more preferably 0.4 nm to 1 μm.

The average fiber diameter of the boron nitride fibers is preferably 10 to 700 nm, more preferably 20 to 500 nm. An example of the boron nitride fiber is a fibrous structure typified by a boron nitride nanotube and a boron nitride nanorod. Out of these, the fiber assembly is preferably composed of boron nitride nanotubes. The boron nitride nanotubes are contained in the fiber assembly in an amount of preferably 1 to 100 wt %, more preferably 10 to 100 wt %.

It is known that an arc discharge, laser heating or chemical vapor deposition process may be used to manufacture the above boron nitride nanotubes. There is also known a process in which the boron nitride nanotubes are synthesized from borazine by using nickel boride as a catalyst. There is also proposed a process in which the boron nitride nanotubes are synthesized by reacting boron oxide with nitrogen using a carbon nanotube as a templating molecule. The boron nitride fibers used in the present invention are not limited to these manufactured by the above processes. The boron nitride fibers may be treated with a strong acid or chemically modified.

Preferably, the average aspect ratio of the fibers constituting the fiber assembly is 5 or more, and further the boron nitride fibers do not substantially include fibers having an aspect ratio of less than 5. The expression "not substantially include" means that fibers having a fiber length with an aspect ratio of 5 or less are not observed at any site through a scanning electron microscope. When fibers having a fiber length with an aspect ratio of 5 or less are included in the boron nitride fibers, the mechanical strength of the obtained fiber paper may become unsatisfactory. It is preferred that fibers having a fiber length with an aspect ratio of 10 or less should not be substantially included in the boron nitride fibers, and it is more preferred that fibers having a fiber length with an aspect ratio of 20 or less should not be included.

The fiber paper of the present invention may contain a component not having a fibrous shape, such as an inorganic particle or a binder component. The mechanical properties of the fiber paper can be improved by further mixing a binder component with the fiber assembly.

To manufacture the fiber paper of the present invention, any process may be employed if the above-described fiber paper is obtained. The process including the step of manufacturing boron nitride fibers, the step of dispersing the fibers into an organic solvent or a surfactant aqueous solution and the step of making paper from the dispersion of the fibers is a preferred example of the process of manufacturing a fiber paper. In the manufacturing process of the present invention, unlike a process of manufacturing a fiber paper from carbon nanotube fibers (refer to JP-A 2006-335604) in which the step of introducing a polar group into fibers by an oxidation treatment or an acid treatment is required before the manufactured fibers are dispersed into a medium, it is unnecessary to introduce the polar group by the above treatment and preferred not to.

The fibers may be in a state that they are formed by removing the solvent into which the fibers have been dispersed or that they contain part of the solvent.

As for the paper making method, known dehydration or drying methods may be used in the paper making step but any technique such as one using a long net or round net, or one for removing water by compression or suction with a press roll, suction roll or suction unit, or drying with heat or air may be employed.

In the present invention, a wet paper making process in which the obtained fibers are dispersed into a surfactant aqueous solution or a suitable organic solvent to prepare a slurry and then a wet paper web is formed, dehydrated and dried is employed. At this point, a binder component can be uniformly applied by dispersing it together with the fibers.

To disperse the boron nitride fibers into the surfactant aqueous solution or organic solvent, a treatment such as agitation, vibration or ultrasonic irradiation is preferably carried out, out of which ultrasonic irradiation is particularly preferred.

As for dispersion, the mixing ratio of the boron nitride fibers to the surfactant aqueous solution or organic solvent is preferably 0.1:100 to 100:100 (weight ratio), particularly preferably 0.5:100 to 20:100 (weight ratio).

The content of the surfactant in the surfactant aqueous solution is preferably 0.05 to 20 wt %, particularly preferably 0.1 to 10 wt %.

When the surfactant aqueous solution is used as a dispersion medium, any conventionally known surfactant may be used as the surfactant. The surfactant is an anionic surfactant, cationic surfactant, amphoteric surfactant and/or nonionic surfactant. Examples of the anionic surfactant include 1) alkyl sulfate and salt thereof typified by sodium dodecylsulfate, 2) olefin sulfonic acid, aryl sulfonic acid and salt thereof typified by sodium laurylsulfonate, sodium dodecylbenzenesulfonate and sodium dodecylnaphthalenesulfonate, 3) aliphatic carboxylic acid and salt thereof typified by sodium palmitate, sodium laurate and potassium stearate, and 4) amide sulfonic acid and salt thereof typified by sodium oleic amide sulfonate. Examples of the cationic surfactant include 1) quaternary alkyl ammonium, quaternary aryl ammonium and salt thereof such as octyl trimethylammonium chloride, dodecyl trimethylammonium bromide, cetyl trimethylammonium chloride and phenyl trimethylammonium chloride, 2) quaternary alkyl phosphonium and salt thereof such as octyl trimethylphosphonium chloride, dodecyl trimethylphosphonium bromide and cetyl trimethylphosphonium chloride, 3) alkyl pyridinium and salt thereof such as cetyl pyridinium chloride and lauryl pyridinium sulfate, 4) aminoalkylamide typified by diethylaminoethyl oleyl amide, and 5) alkylamine and salt thereof typified by decylamine hydrochloride, dodecylamine hydrochloride, dioctylamine hydrochloride, and triethanolamine and hydrochloride thereof. Examples of the amphoteric surfactant include 1) alkylaminocarboxylic acid such as betaine and 2) amphoteric phosphate typified by phosphatidyl choline and sphingomyelin. Examples of the nonionic surfactant include 1) polyoxyalkylene glycol typified by polyoxyethylene glycol and polyoxypropylene glycol, 2) polyoxyethylene alkyl and aryl ether typified by polyoxyethylene nonyl ether and polyoxyethylene phenyl ether, 3) polyalkylene imine typified by polyethylene imine and alkylated products thereof, 4) pentaerythritol carboxylates such as pentaerythritol benzoate, 5) fatty acid ethanol amide typified by lauric acid ethanol amide, and 6) higher alcohol typified by octyl alcohol, lauryl alcohol, myristyl alcohol and cetyl alcohol.

The surfactant is preferably a cationic surfactant having 10 to 23 carbon atoms, more preferably a quaternary ammonium salt cationic surfactant having 11 to 19 carbon atoms, particularly preferably a quaternary ammonium halide cationic surfactant having 11 to 19 carbon atoms.

When an organic solvent is used as the dispersion medium, the organic solvent is selected from the group consisting of alcohol, amine, organic carboxylic acid, organic carboxylate, organic acid amide, ketone, ether, sulfoxide, sulfone and sulfolane, each of them having 1 to 10 carbon atoms. Examples of the organic solvent include 1) aliphatic and aromatic alcohol typified by methanol, ethanol, propanol, 2-propanol, butanol, isobutanol, pentanol, isopentanol, hexanol, cyclohexanol, heptanol, octanol, decanol, benzyl alcohol and phenol: or phenol compound, 2) aliphatic and aromatic amine such as diethylamine, triethylamine, propylamine, butylamine, hexylamine, octylamine, ethylenediamine, 2-aminoethanol, aniline and toluidine, 3) aliphatic carboxylic acid typified by formic acid, acetic acid, propionic acid, butyric acid, isobutyric acid, hexanoic acid and octanoic acid, 4) carboxylate such as ethyl formate, n-propyl formate, methyl acetate, ethyl acetate, propyl acetate, butyl acetate, amyl acetate, isoamyl acetate, n-pentyl acetate, benzyl acetate, methyl propionate, ethyl propionate, ethyl butyrate and ethyl benzoate, 5) amide solvent such as formamide, N,N,N',N'-tetramethylurea (TMU), N,N-dimethylacetamide (DMAc), N,N-diethylacetamide (DEAc), N,N-dimethylpropionamide (DMPr), N,N-dimethylbutylamide (NMBA), N,N-dimethylisobutylamide (NMIb), N-methyl-2-pyrrolidinone (NMP), N-cyclohexyl-2-pyrrolidinone (NCP), N-ethyl-2-pyrrolidinone (NEP), N-methylcaprolactam (NMC), N,N-dimethylmethoxyacetamide, N-acetylpyrrolidine (NARP), N-acetylpiperidine, N-methylpiperidone-2 (NMPD), N,N'-dimethylethyleneurea, N,N'-dimethylpropyleneurea, N,N,N',N'-tetramethylmaloneamide and N-acetylpyrrolidone, 6) ketone such as acetone, methyl ethyl ketone, 2-pentanone, 3-pentanone, 2-hexanone, 3-hexanone, methyl isobutyl ketone, acetophenone, propiophenone, n-butyrophenone, cyclopentanone, cyclohexanone, cycloheptanone, acetylacetone, biacetyl and pinacolone, 7) ether typified by diethyl ether, di-n-propyl ether, diisopropyl ether, n-butyl ether, anisole, phenetol, tetrahydrofuran, tetrahydropyran and 1,4-dioxane, 8) sulfoxide typified by dimethyl sulfoxide, and 9) sulfone such as diethyl sulfone and sulfolane such as sulfolane. Other organic solvent such as hydrocarbon, halogenated hydrocarbon, nitrile and carbonate may also be used in the present invention if they do not have any handling problem. These organic solvent may be used alone, mixed together as required or mixed with water. An inorganic fiber paper having various functions can be obtained by dispersing other fibers and additives at the same time to make a wet paper web.

EXAMPLES

The following examples are provided for the purpose of further illustrating the present invention but are in no way to be taken as limiting. Values in the examples were obtained by the following methods.
(1) Shape of Boron Nitride Fiber to be Used for Paper Making The average fiber diameter and average length of the boron nitride fibers used for paper making were determined from the average values of arbitrary 150 fibers by carrying out dynamic light scattering measurement with the ZDLS-7000 of Otsuka Electronics Co., Ltd. at a concentration of 0.001 wt % after they were prepared.
(2) Observation of Obtained Fiber Paper through Scanning Electron Microscope The average fiber diameter and average length of the boron nitride fibers were evaluated from the average values of arbitrary 150 fibers by observing the surface structure of the boron nitride fiber paper obtained from the boron nitride fibers through a scanning electron microscope (S-2400 of Hitachi, Ltd.).
(3) Measurement of Weight Ratio of Boron Nitride-Based Fibers Having a Fiber Diameter of Not More Than 1 μm in Obtained Fiber Paper 1 g of the obtained fiber paper was ultrasonically dispersed into 500 ml of 100% formic acid again to obtain a suspension of the boron nitride-based fibers. Since rough fibers having a fiber diameter of more than 1 μm and granular insoluble matter were precipitated from this suspension, they were removed, only the supernatant suspension was filtered with a membrane filter (opening diameter of 0.2 μm) again to collect all the suspended matter, and the suspended matter was dried to measure its weight so as to obtain its weight ratio.
(4) Measurement of Weight Ratio of Boron Nitride Nanotubes in Obtained Fiber Paper 1 g of the obtained fiber paper was ultrasonically dispersed into 500 ml of formic acid again to obtain a suspension of the boron nitride-based fibers. Since rough fibers having a fiber diameter of more than 1 μm and granular insoluble matter were precipitated from this suspension, they were removed, only the supernatant suspension was suction filtered with a sieve having a mesh size of 10 μm to remove fibrous products larger than the nanotube (diameter of around 10 to 50 nm), only nanotubes passing through the filter were collected together with the filtrate by using a membrane filter (opening diameter of 0.2 nm), and the suspended matter was dried to measure its weight so as to obtain its weight ratio.

Reference Example 1

Manufacture of Boron Nitride Nanotubes as Raw Material for Boron Nitride-Based Fiber Paper Boron and magnesium oxide were put into a boron nitride crucible in a molar ratio of 1:1, and the crucible was heated at 1,300° C. in a high-frequency induction heating furnace. Boron and magnesium oxide were reacted with each other to form gaseous boron oxide ($B_2O_2$) and magnesium vapor. These products were transferred to a reaction chamber by an argon gas, and an ammonia gas was introduced while the temperature was kept at 1,100° C. Boron oxide and ammonia were reacted with each other to form boron nitride. When 1.55 g of the mixture was fully heated to evaporate a by-product, 310 mg of a white solid was obtained from the wall of the reaction chamber. Then, the obtained white solid was cleaned with concentrated hydrochloric acid and then with ion exchange water until its pH became neutral and dried under reduced pressure at 60° C. to obtain boron nitride nanotubes (may be abbreviated as "BNNT" hereinafter). The obtained BNNT's were tubular with an average diameter of 27.6 nm and an average length of 2,460 nm.

Example 1

1 g of the boron nitride nanotubes obtained in Reference Example 1 was added to 100 ml of a 5% dodecyl trimethylammonium bromide aqueous solution, and an ultrasonic treatment was carried out with a 3-frequency ultrasonic cleaner (manufactured by AS ONE CORPORATION, output of 100 W, 28 Hz) for 10 minutes to obtain a dispersion of boron nitride nanotubes. The boron nitride nanotubes in the obtained suspension were still dispersed in the medium without being agglomerated and precipitated macroscopically even after they were left for 1 hour. The suspension of boron nitride nanotubes uniformly dispersed therein was spread over a filter having an area of 5 cm×5 cm, collected by sucking the solvent and dried to prepare a boron nitride fiber paper having a weight of 400 g/m$^2$. It was confirmed by observation through a scanning electron microscope that a paper-like structure based on a fine fiber structure composed of multiple layers of entangled boron nitride nanotubes was formed (FIG. 1).

When this fiber paper was measured by the method (3), the content of the boron nitride fibers having a fiber diameter of not more than 1 μm was 99.9 wt % based on the total of all the constituent components. When the fiber paper was measured by the method (4), the content of the boron nitride nanotubes was 95 wt % based on the total of all the constituent components. The fiber assembly had an average fiber diameter of 28 nm and an average aspect ratio of 88.

Example 2

Figure 2:
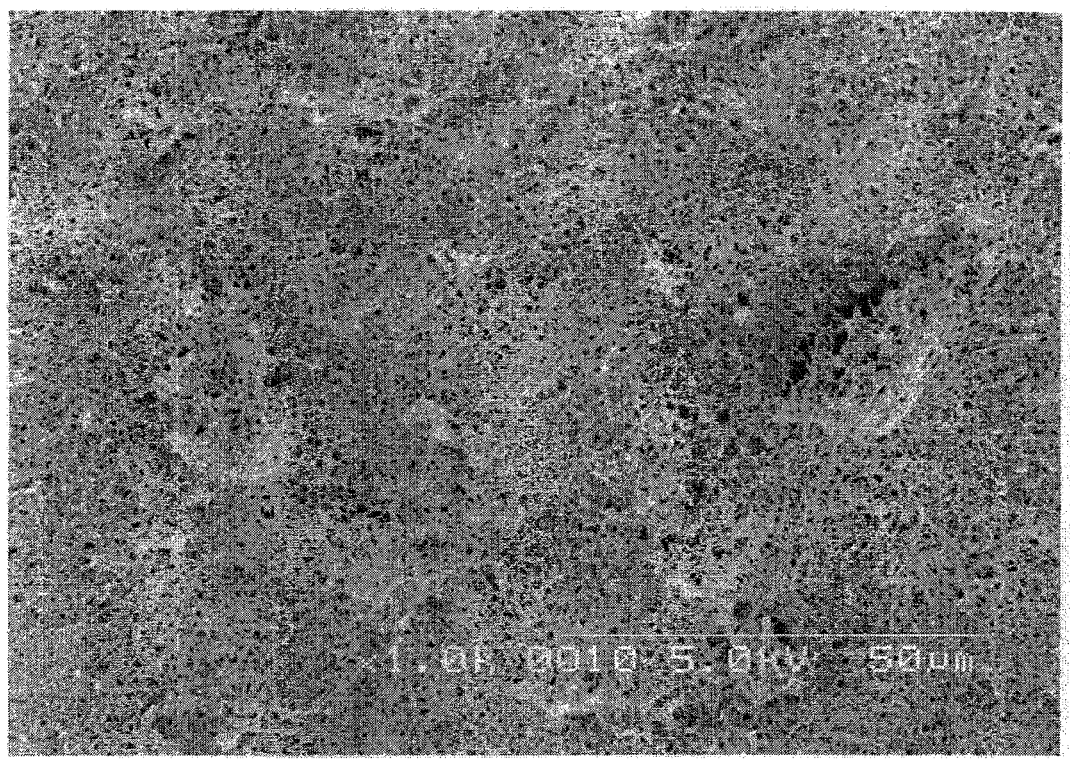
FIG. 2 is a SEM photomicrograph of a fiber paper obtained in Example 2.

A boron nitride fiber paper having a weight of 400 g/m$^2$ was prepared in the same manner as in Example 1 except that 2-propanol was used as the solvent in place of the 5% dodecyl trimethylammonium bromide aqueous solution. It was confirmed by observation through a scanning electron microscope that a paper-like texture based on a fine fiber structure composed of multiple layers of entangled boron nitride nanotubes was formed (FIG. 2). When this fiber paper was measured by the method (3), the content of the boron nitride fibers having a fiber diameter of not more than 1 μm was 99.8 wt % based on the total of all the constituent components. When the fiber paper was measured by the method (4), the content of the boron nitride nanotubes was 95 wt % based on the total of all the constituent components. The fiber assembly had an average fiber diameter of 28 nm and an average aspect ratio of 87.6.

Comparative Example 1

A suspension of boron nitride nanotubes was prepared in the same manner as in Example 1 except that ion exchange water was used as the solvent. When the suspension was left to stand, the boron nitride nanotubes were phase separated from the solvent macroscopically immediately. When this suspension was spread over a filter to collect the boron nitride fibers by sucking the solvent, the boron nitride fibers forming an agglomerate were not uniformly collected, a fiber agglomerate which was not uniform macroscopically was formed, and a homogeneous boron nitride fiber paper could not be obtained.

The boron nitride fiber paper obtained by the manufacturing process of the present invention may be used alone or in combination with another member according to handling and other requirements. For instance, it may be laminated with a nonwoven fabric, woven fabric or film and impregnated with a resin to obtain a prepreg.

Further, the obtained boron nitride fiber paper may be subjected to a heat treatment or chemical treatment, or mixed with an emulsion, organic or inorganic material powder or filler. For instance, a catalyst may be supported on the boron nitride fiber paper of the present invention to use it as a catalyst carrier substrate.

It may be further used as an electronic substrate material or supporting material, making use of its heat conductivity and mechanical properties. Since the boron nitride fiber paper of the present invention has heat resistance and is very fine, it can be used for heat resistance applications and filters.

Since the boron nitride fiber paper of the present invention is formed of fibers having a fiber diameter ranging from nano to submicron order, it can be made thin while keeping the characteristic properties of the fibers and maintaining the excellent heat resistance, mechanical strength and heat conductivity of the boron nitride fibers. Therefore, it can be advantageously used as an industrial member such as a substrate for heat-resistant filters having high permeability and electronic circuit board laminates, insulating heat conducting raw material or reinforcing thin film for construction materials. A boron nitride fiber paper having a very large surface area can also be obtained.

Further, the obtained boron nitride fiber paper can be used as it is or may be used in combination with another member according to handling and other requirements.

The invention claimed is:

1. A fiber paper comprises a fiber assembly which contains boron nitride fibers having a fiber diameter of not more than 1 μm in an amount of not less than 40 wt %,
    wherein the boron nitride fibers are boron nitride nanotubes.

2. The fiber paper according to claim 1, wherein the average fiber diameter of the fibers constituting the fiber assembly is 0.4 nm to 1 μm.

3. The fiber paper according to claim 2, wherein the average aspect ratio of the fibers constituting the fiber assembly is not less than 5.

4. The fiber paper according to claim 1, wherein the average aspect ratio of the fibers constituting the fiber assembly is not less than 5.

5. The fiber paper according to claim 1, wherein the fiber assembly contains the boron nitride nanotubes in an amount of 1 to 100 wt %.

6. A process of manufacturing the fiber paper of claim 1, comprising the steps of:
    dispersing a fiber assembly which contains boron nitride fibers having a fiber diameter of not more than 1 μm in an amount of not less than 40 wt % into a surfactant aqueous solution or an organic solvent; and
    making paper from the obtained dispersion,
    wherein the boron nitride fibers are boron nitride nanotubes.

7. The process according to claim 6, wherein a surfactant aqueous solution or an organic solvent is used as a dispersion solvent.

8. The process according to claim 6, wherein the organic solvent is at least one selected from the group consisting of an alcohol, amine, organic carboxylic acid, organic carboxylate ester, organic acid amide, ketone, ether, sulfoxide, sulfone and sulfolane, each of them having 1 to 10 carbon atoms.

* * * * *